United States Patent
Baney et al.

(10) Patent No.: US 7,707,000 B2
(45) Date of Patent: Apr. 27, 2010

(54) TEST INSTRUMENT AND SYSTEM RESPONSIVE TO EXECUTION TIME DATA

(75) Inventors: Douglas M. Baney, Los Altos, CA (US); John C. Eidson, Palo Alto, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 114 days.

(21) Appl. No.: 11/737,682

(22) Filed: Apr. 19, 2007

(65) Prior Publication Data

US 2008/0263411 A1   Oct. 23, 2008

(51) Int. Cl.
*G01R 27/28* (2006.01)
*G06F 1/04* (2006.01)

(52) U.S. Cl. ...................................... 702/118; 713/600

(58) Field of Classification Search ................. 702/118, 702/108, 116–117, 119–123, 125; 714/724, 714/731, 744, 47; 700/306; 324/73.1; 709/208–209; 713/400, 500, 600
See application file for complete search history.

(56) References Cited

U.S. PATENT DOCUMENTS

| | | | | | |
|---|---|---|---|---|---|
| 4,397,021 | A | * | 8/1983 | Lloyd et al. ................... | 714/33 |
| 4,402,055 | A | * | 8/1983 | Lloyd et al. ................... | 702/121 |
| 5,293,374 | A | * | 3/1994 | Eidson ........................ | 702/117 |
| 5,748,642 | A | * | 5/1998 | Lesmeister .................... | 714/724 |
| 6,966,019 | B2 | * | 11/2005 | Viens et al. .................... | 714/724 |
| 7,035,755 | B2 | * | 4/2006 | Jones et al. .................... | 702/121 |
| 7,043,390 | B2 | * | 5/2006 | Jones et al. .................... | 702/117 |
| 7,248,986 | B2 | * | 7/2007 | Klijn et al. .................... | 702/115 |
| 2006/0247881 | A1 | * | 11/2006 | Laquai et al. ................. | 702/117 |
| 2007/0132477 | A1 | * | 6/2007 | Balog et al. ................... | 324/765 |
| 2008/0059108 | A1 | * | 3/2008 | Gil et al. ...................... | 702/121 |

* cited by examiner

*Primary Examiner*—Michael P. Nghiem
*Assistant Examiner*—Toan M Le

(57) ABSTRACT

Test instruments constituting an automatic test system are characterized in terms of execution time data. The execution time data is composed of a set of execution times. Each of the execution times is the time required for the test instrument to perform a respective testing operation. The test instruments additionally have the ability to communicate their respective execution time data to such recipients as others of the test instruments, the system controller and recipients outside the automatic test system. Additionally, such test instruments have the ability to communicate test results to at least one other of the test instruments and the ability to process test results received from at least one other of the test instruments. Such characterization, communication and processing allows a system integrator to devise execution time-dependent test programs as part of a test suite that allows test throughput to be maximized.

22 Claims, 8 Drawing Sheets

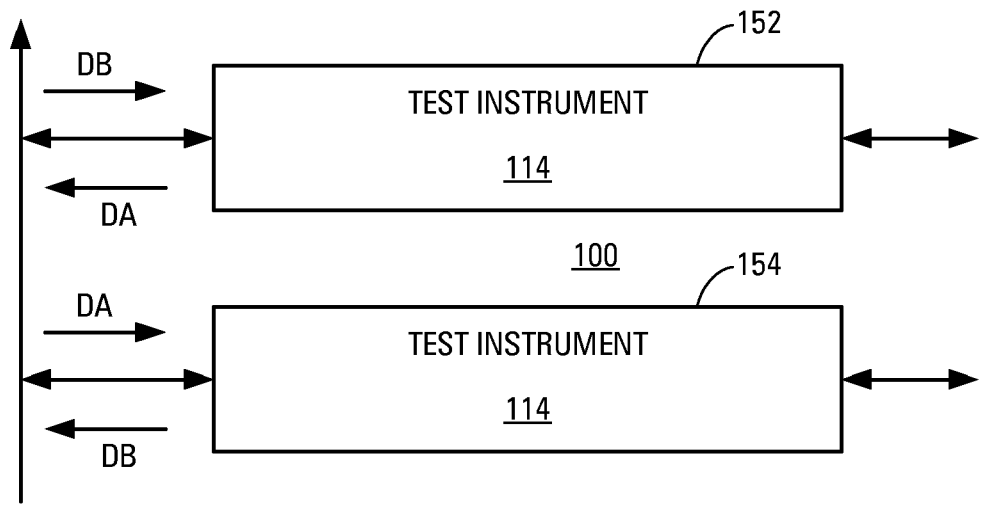
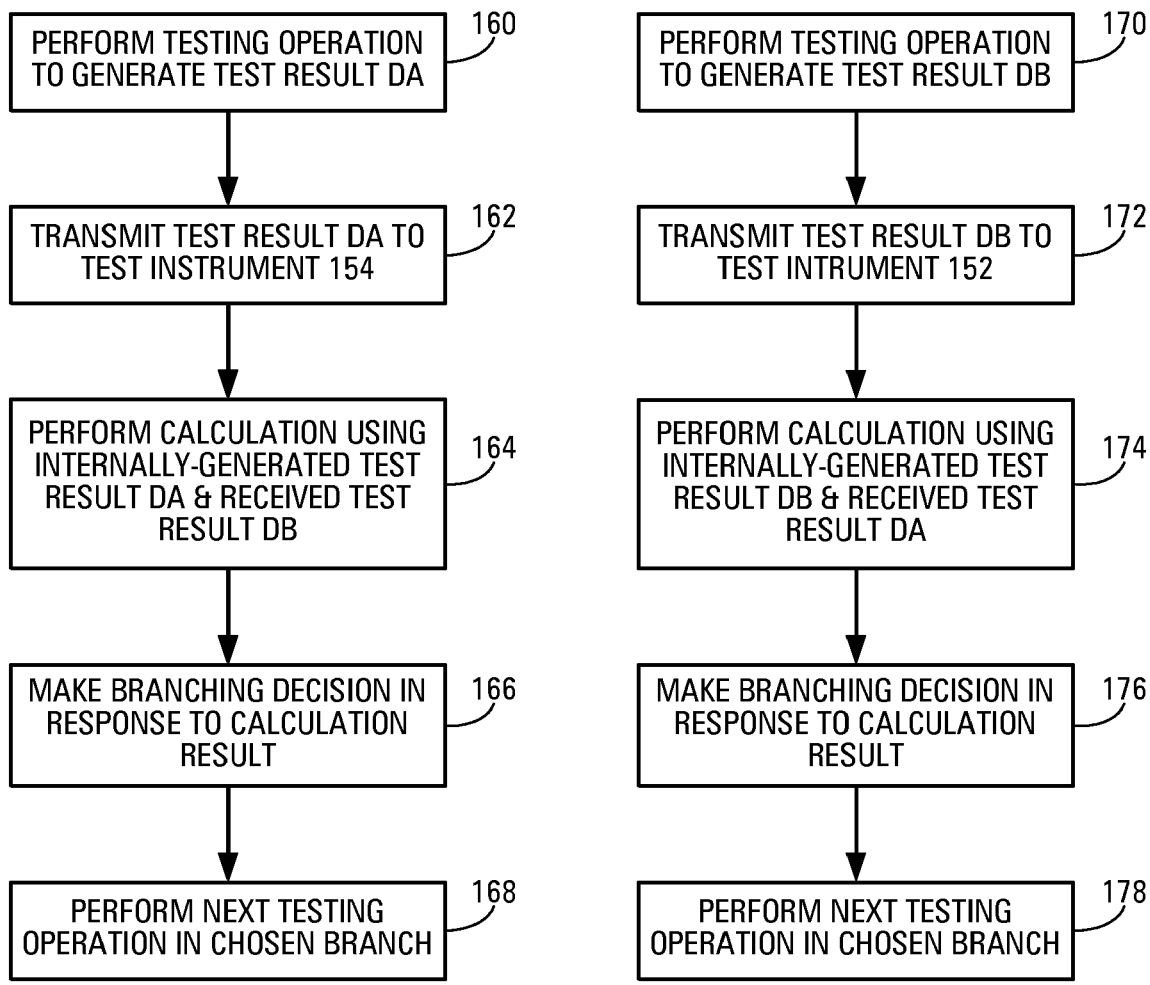
FIG.5
FIG.6A
FIG.6B

US 7,707,000 B2

TEST INSTRUMENT AND SYSTEM RESPONSIVE TO EXECUTION TIME DATA

BACKGROUND

Automatic test systems are used to test electronic products. FIG. 1 is a block diagram showing a simplified view of an example of a conventional automatic test system 10. Test system 10 is composed of a system controller 12, a number of test instruments 14 and a test fixture 16. Test fixture 16 provides an interface that allows test system 10 to exchange signals with a unit under test (UUT). System controller 12 is connected to a control port of each of the test instruments 14 via a suitable communication link or network such as GPIB or, more typically, via an Ethernet local area network 18. System controller 12 is additionally connected to the UUT via test fixture 16 and network 18. Test instruments 14 operate in response to commands output by system controller 12 to monitor or control various inputs and outputs of unit under test UUT via test fixture 16. In the example shown, the test instruments are indicated by the same reference numeral 14 but in practice the test instruments that constitute automatic test system 10 differ from one another. The number of test instruments may differ from the number in the example shown. Exemplary ones of the test instruments 14 are indicated at 22 and 24.

An automatic test system such as automatic test system 10 tests a UUT by subjecting the UUT to a sequence of tests. Such sequence of tests will be referred to as a test sequence. In each test in the test sequence, the automatic test system measures the response of the UUT to a stimulus, and compares the response to one or more test limits to determine whether the unit under test has passed or failed the test. The stimulus is typically generated by one of the test instruments 14 constituting test system 10 but may additionally or alternatively be provided by a source external to test system 10. Passing the test typically causes the automatic test system to subject the UUT to the next test in the test sequence. Failing the test may cause the automatic test system to stop testing the unit under test. Alternatively, the automatic test system may repeat the failed test and only stop the testing if the UUT fails the test a predetermined number of times consecutively.

FIG. 2 is a flow chart illustrating a portion of a typical test sequence 30 performed by conventional automatic test system 10 described above with reference to FIG. 1. In block 32, system controller 12 issues commands that configure test instruments 14 to perform a test n. For example, in block 32, the command issued by system controller 12 defines the parameters of a stimulus that will be generated by test instrument 22 and additionally defines a set of measurement parameters that will be used by test instrument 24 to measure the response of the UUT to the stimulus.

In block 34, system controller 12 issues a command that causes test instruments 14 to perform test n. For example, in block 34, the command issued by system controller 12 causes test instrument 22 to generate the stimulus defined in block 32 and to apply such stimulus to the UUT via test fixture 16. The command additionally causes test instruments 24 to receive a response of the UUT to the stimulus via test fixture 16 and to measure the response using the specified measurement parameters.

In block 36, a test is performed to determine whether the UUT has passed test n. For example, in block 36, system controller 12 issues a command that causes test instrument 24 to compare the measurement made in block 34 with a predetermined test limit. The command additionally causes test instrument 24 to return a test result YES when the measurement is within the test limit, otherwise to return a test result NO, and to output the test result to system controller 12. The test result received by system controller 12 determines the future course of the test sequence.

A YES result received by system controller 12 in block 36 causes automatic test system 10 to perform blocks 42 and 44. Blocks 42 and 44 are similar to blocks 32 and 34, respectively, and respectively cause test system 10 to configure itself to perform a test n+1 and to apply test n+1 to the UUT. Blocks 42 and 44 will not be described further.

A NO result in block 36 causes automatic test system 10 to perform block 38. In block 38, controller 12 determines whether the UUT has failed test n a predetermined number m of times.

A YES result in block 38 causes the test sequence to end. A NO result in block 38 causes execution to return to block 34, where test n is executed again. Execution of the loop composed of blocks 34, 36 and 38 continues until a YES result is obtained in block 36 (test n+1 then executes) or a YES result is obtain in block 38 (test sequence then ends).

As electronic products have become more complex, the time required for the automatic test system to test each unit under test has increased. Moreover, the cost of the constituent components of the electronic products has fallen. Consequently, the fraction of the cost of manufacture represented by the cost of testing has undesirably increased.

What is needed is a way to reduce the cost of testing an electronic product.

BRIEF DESCRIPTION OF THE DRAWINGS

FIG. 5 is a block diagram illustrating an example of a communication process performed by two of the test instruments and part of the local area network that collectively constitute part of the test system shown in FIG. 4.

FIGS. 6A and 6B are flow charts illustrating the processing performed by two of the test instruments in the test system shown in FIG. 4.

DETAILED DESCRIPTION

The cost of testing an electronic product can be reduced by reducing the time required for the automatic test system to test each unit under test (UUT). This increases the number of UUTs that the automatic test system can test per unit time, and, hence, reduces the cost of testing each UUT. However, it is difficult to obtain a significant reduction in the time taken by a conventional automatic test system to test each UUT.

Figure 1:
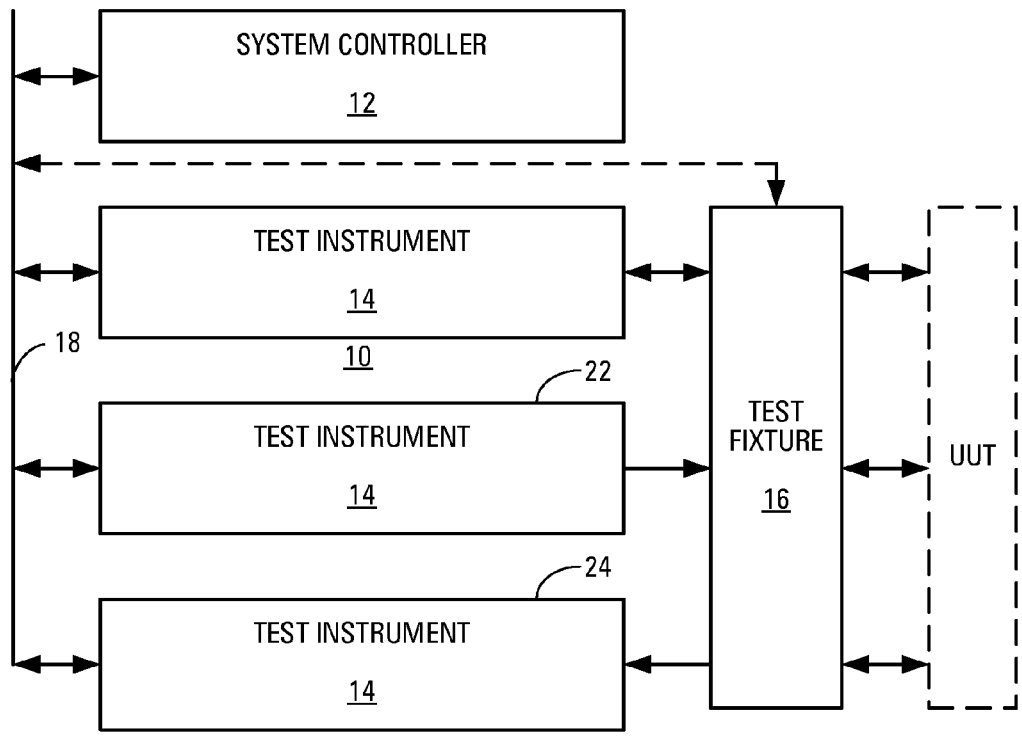
FIG. 1 is a block diagram showing a simplified view of an example of a conventional automatic test system.
Figure 2:
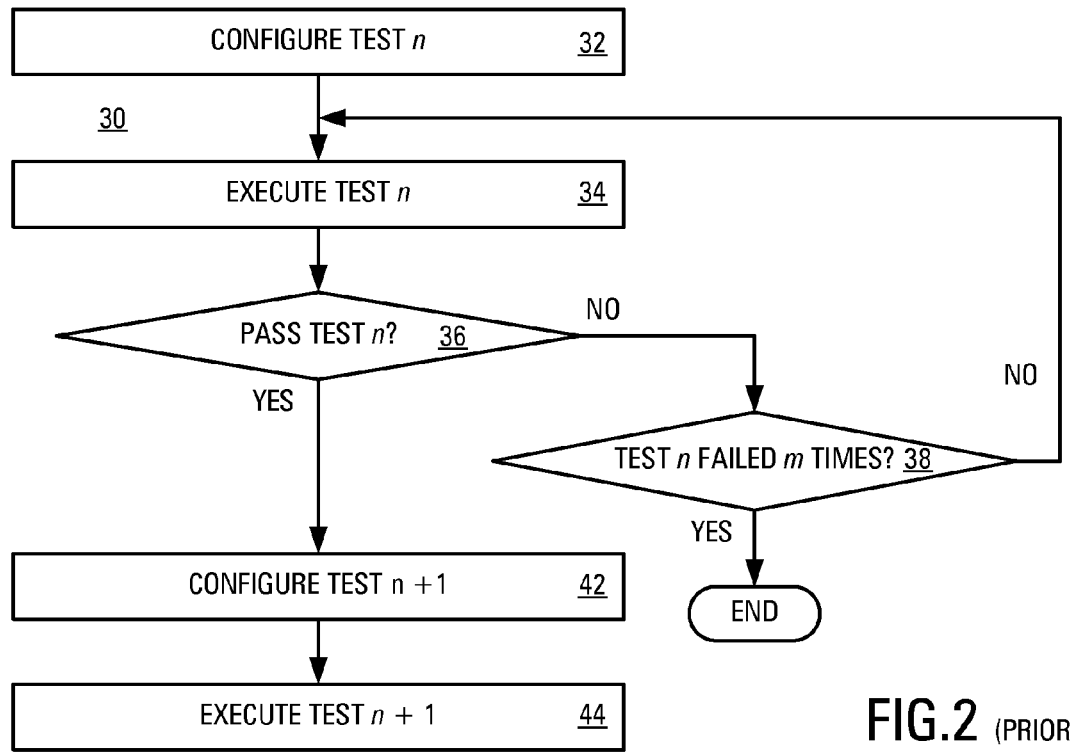
FIG. 2 is a flow chart illustrating a portion of a typical test sequence performed by the conventional automatic test system shown in FIG. 1.

The actual times taken by the system controller 12 and test instruments 14 of conventional automatic test system 10 described above with reference to FIGS. 1 and 2 to perform the testing operations that constitute the test sequence system are unknown. The time taken by system controller 12 or one of test instruments 14 constituting part of automatic test system 10 to perform a given testing operation will be referred to as the execution time of the testing operation. Without knowledge of such execution times, the strictly sequential execution process illustrated in FIG. 2 is all that can be reliably programmed. Execution of a later block of the test sequence must wait until execution of an earlier block is complete. With this strict sequential execution, the only way to reduce the time needed to execute the test sequence is to increase the operational speed of system controller 12 and/or the individual test instruments 14. This approach can increase the cost of test since it requires faster, more expensive test instruments that typically have increased power consumption.

In addition, depending on the test result obtained in a given test, automatic test system 10 typically makes decisions that determine the future progression of the test sequence, as in the example described above with reference to FIG. 2. In an example, a failure of test n causes the test sequence to terminate, or causes automatic test system 10 to repeat the failed test.

Figure 3:
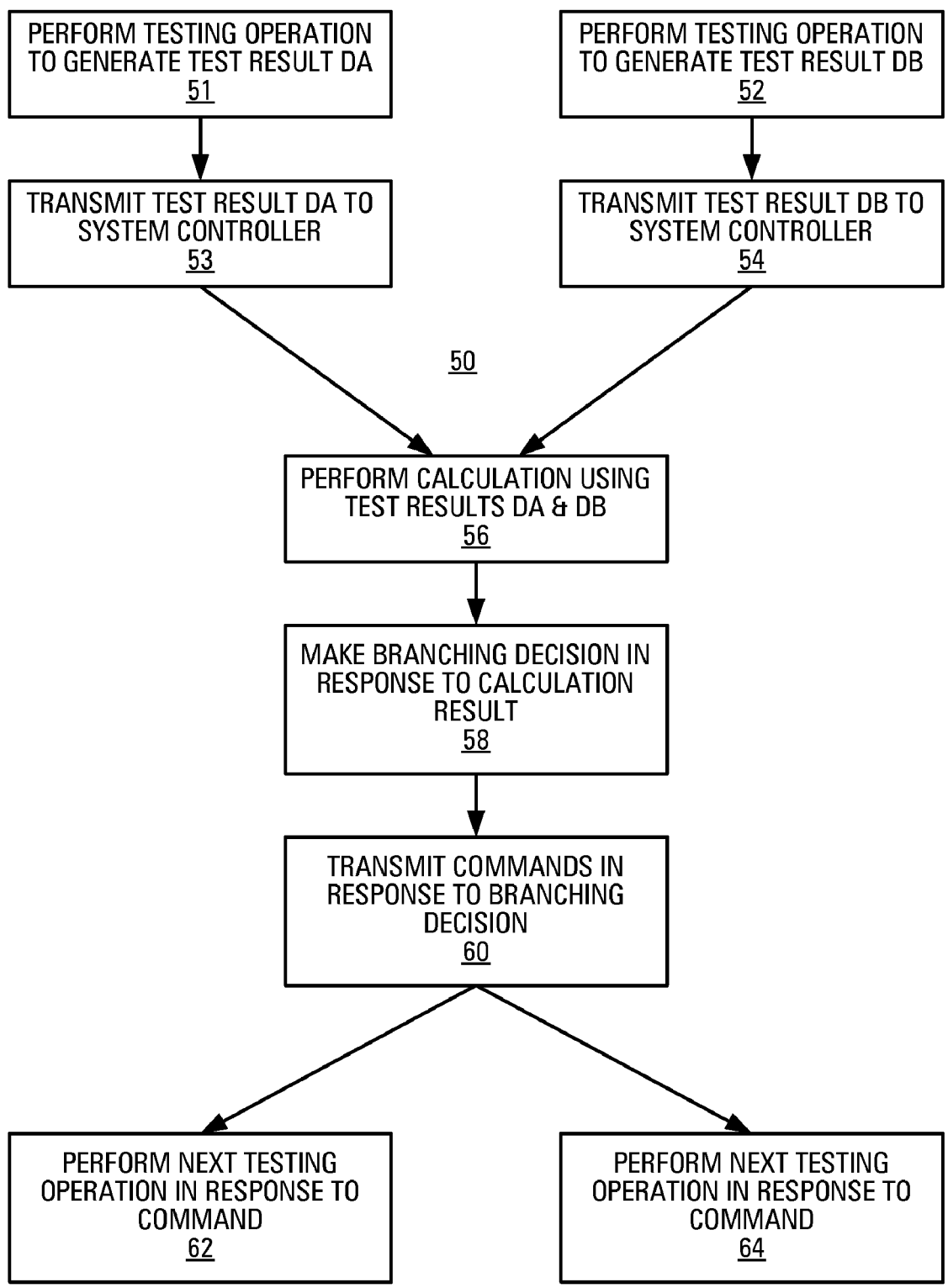
FIG. 3 is a flow chart illustrating an example of a branching decision process made by an example of the conventional automatic test system 10 shown in FIG. 1.

Another execution time issue occurs in conventional automatic test system 10 when test instruments 22 and 24 produce test results DA and DB, respectively, and a branching decision similar to that performed in block 36 (FIG. 2) determines which branch of the test sequence is to be executed next based on a calculation made using both test results DA and DB. FIG. 3 is a flow chart illustrating an example of a branching decision process 50 made by an example of conventional automatic test system 10. In blocks 51 and 52, test instruments 22 and 24 generate test results DA and DB, respectively. In blocks 53 and 54, test instruments 22 and 24 transmit test results DA and DB, respectively, to system controller 12. In block 56, system controller 12 performs the calculation using test results DA and DB, and, in block 58, makes a branching decision depending on the result of the calculation. In block 60, the system controller transmits commands generated in response to the branching decision to one or more of the test instruments 14. The commands configure the test instruments appropriately to perform the next test in the selected branch of the test sequence. In blocks 62 and 63, test instruments 22 and 24 operate in response to the commands to perform the next testing operation in the selected branch of the test sequence.

Each communication, for example, sending test result DA from test instrument 22 to system controller 12, or sending a command from system controller 12 to one or more of test instruments 14, experiences the communication latency of the protocol stacks of the communicating elements. Additional communication latency arises from delays in any network components, such as switches, located between the communicating elements. The architecture of conventional automatic test system 10 makes such communication latencies difficult to reduce or eliminate.

Other issues that arise from the unknown execution times of conventional automatic test systems include UUT transportability, stimulus and measurement synchronization and functional test.

With respect to UUT transportability, the unknown execution times of conventional automatic test system 10 mean that when electronic products of a given product design are tested using a new or upgraded automatic test system, critical timing relationships typically change. This is because the execution times of the new automatic test system are typically different from those of the old automatic test system. Consequently, optimizations made during testing using the old automatic test system are no longer applicable when the new automatic test system is used even though the electronic products being tested remain unchanged.

In stimulus and measurement synchronization, the unknown execution times of conventional automatic test systems can make it difficult to establish and quantify the timing relationships among the signals respectively generated and received by the automatic test system.

In functional test, difficulties arise from the difficulty in observing or controlling the timing relationships between the UUT and the test instruments constituting the automatic test system.

Thus, with conventional automatic test systems it is difficult to maximize test throughput due to the unknown execution times and the relative inflexibility imposed by the conventional master-slave architecture of such systems. In the master-slave architecture, system controller 12 controls the test sequence and the analysis of the test results. However, in such conventional automatic test systems, system controller 12 has no information indicating the actual time it takes to execute each test, so the strictly sequential execution described above with reference to FIG. 2 is all that can be reliably programmed. This greatly reduces the opportunities to optimize testing throughput.

In accordance with an embodiment of the invention, the test instruments constituting an automatic test system are characterized in terms of execution time data. The execution time data is composed of a set of execution times. Each of the execution times is the time required for the test instrument to perform a respective testing operation. The test instruments additionally have the ability to communicate their respective execution time data to such recipients as others of the test instruments, the system controller and recipients outside the automatic test system. Additionally, such test instruments have the ability to communicate test results to at least one other of the test instruments and the ability to process test results received from at least one other of the test instruments. Such characterization, communication and processing allows a system integrator to devise execution time-dependent test programs as part of a test suite that allows test throughput to be maximized.

Figure 4:
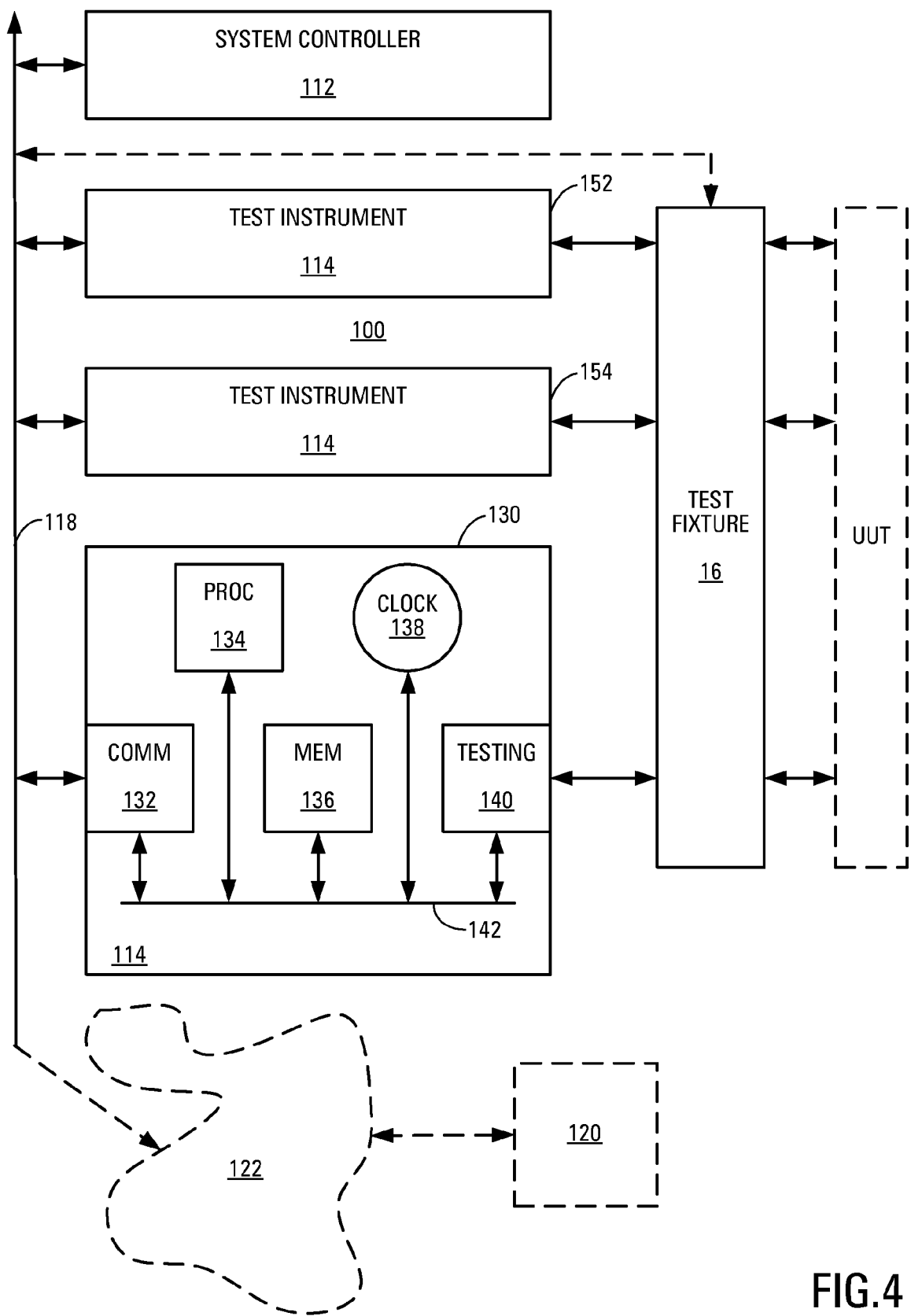
FIG. 4 is a block diagram showing an example of a test system in accordance with an embodiment of the invention.

FIG. 4 is a block diagram showing an example of a test system 100 in accordance with an embodiment of the invention. Test system 100 is composed of a number of test instruments 114 and a test fixture 16. One of the test instruments 114 operates as a system controller and will be referred to as system controller 112. Test fixture 16 provides an interface that connects the test instruments 114 constituting test system 100 to a unit under test (UUT). System controller 112 is not connected directly to test fixture 16 in the example shown, but is in other examples.

Each of the test instruments 114 has a communication port to which a local area network 118, such as an Ethernet local area network, is connected. In some embodiments, local area network 118 additionally connects to the UUT via test fixture 16. Optionally, local area network 118 communicates with one or more devices external to test system 100. Such communication may be direct or indirect via one or more additional networks. In the example shown, local area network 118 communicates with an external device 120 via a wide-area network 122, e.g., the Internet.

FIG. 4 additionally shows the internal structure of an exemplary one 130 of the test instruments 114. Test instrument 130 is composed of a communication module 132, a processing module 134, a memory module 136, a clock module 138, a test module 140 and a bus 142. The other test instruments 114 are similar to test instrument 130 in internal structure, but typically have different test modules 140. In the example shown, system controller 112 is similar to test instrument 130 in internal structure, but lacks a test module. In other examples, system controller 112 has a test module like the remaining test instruments.

In the example of test instrument 130 shown, bus 142 provides bidirectional communication among communication module 132, processing module 134, memory module 136, clock module 138 and test module 140. Alternatively, the interconnections provided by bus 142 may be provided by point-to-point connections among the various modules.

Communication module 132 provides communication between test instrument 130, the other test instruments 114 constituting test system 100 and, optionally, devices external to test system 100. Specifically, communication module 132 provides communication between local area network 118 and bus 142, and, hence between local area network 118 and the remaining modules of test instrument 130. In example in which local area network is an Ethernet network, communication network 132 comprises an Ethernet port and circuitry that provides an interface between bus 142 and the Ethernet port.

Processing module 134 comprises a microprocessor or another computational device (not shown) that operates in response to a program (not shown) stored within the processing module, in memory module 136 or elsewhere. Processing module 134 operates in response to the program to control communication among the remaining modules of test instrument 130. Processor 134 additionally operates in response to the program to control the testing operations performed by test module 140.

Memory module 136 is comprises volatile and non-volatile memory portions. The non-volatile memory portion comprises a read-only portion and a rewritable portion. The read-only portion stores a test program that controls the operation of processor 134. The rewritable portion stores, among other things, the execution time data for test instrument 130. Storing the execution time data in the rewritable portion of memory module 136 allows the execution time data to be updated with operational execution times measured as test instrument 130 operates to test the UUTs. In some embodiments, memory module 136 constitutes part of processing module 134. In embodiments of system controller 112 that lack a test module 140, little or no execution time data are stored in memory module 136.

The clock module 138 of test instrument 130 and the respective clock modules (not shown) of the other test instruments 114 collectively provide test instruments 114 with a common sense of time. Clock module 138 is synchronized with the clock modules of the other test instruments 114 by communication via bus 142, communication port 132 and local area network 118 using an IEEE 1588 protocol or another suitable protocol.

Test module 140 is connected to bus 142, and is additionally connected to the UUT via test fixture 16. Test module 140 is capable of performing one or more testing operation and therefore provides test instrument 130 with its testing functionality. Some embodiments of test module 140 perform a testing operation in which the test module measures one or more properties of a signal received from the UUT via test fixture 16. The measurement properties of the testing operation performed by such test module are defined by configuration data received from processor 134 via bus 142. Other embodiments of test module 140 perform a testing operation in which a stimulus having properties defined by configuration data received from processor 134 via bus 142 is generated, and such stimulus is provided to the UUT via test fixture 16. Yet other embodiments of test module 140 perform a testing operation in which the test module generates a stimulus and additionally measures the properties of signal received from the UUT. Typically the signal whose properties the test module measures is one generated in response to the stimulus. Signal properties capable of being measured in the testing operations performed by various embodiments of test module 140 and stimulus properties capable of being generated by the testing operations performed by various embodiments of test module 140 are known in the art and will not be described further here.

As noted above, test module 140 differs from a test module that constitutes part of a conventional test instrument in that it is characterized by execution time data. The execution time data comprise an execution time that quantifies a time taken by test module 140 to perform a respective testing operation. To fully characterize test module 140, the execution time data are composed by an execution time for each testing operation that test module 140 is capable of performing. However, execution times for some testing operations may be excluded from the testing time data. Typically, each execution time is linked to a code that represents the respective testing operation. Alternatively, each execution time may be linked to the respective testing operation through being stored in a specific location in memory module 136.

As used in this disclosure, the term testing operation encompasses operations in which the test module measures a specified property of a signal received from the UUT, or in which the test module generates a stimulus with specified properties, or in which the measurement configuration of test module 140 is changed in response to a command received from processing module 134, or in which a state of the test module is changed.

In an example in which test module 140 measures the voltage of a signal received from the UUT via test fixture 16, test module 140 performs a first testing operation when, in response to a first command received from processing module 134, it changes its measurement configuration from one in which the range of the voltage measurement is 1V full-scale to one in which the range of the voltage measurement is 10 mV full-scale. Test module 140 performs a second testing operation when, in response to a second command received from processing module 134, it measures the voltage of the signal received from the UUT with the range of the voltage measurement set to 10 mV full-scale to generate a test result. Test module 140 performs a third testing operation when it outputs the test result to bus 142. Communication module 132 performs a fourth testing operation when it outputs the test result to local area network 118.

The execution time data for test module 140 is stored in memory module 136. The execution time data stored in memory module 136 allows processor 134 to control test module 140 using precise information indicating the execution time required by test module 140 to perform each testing operation.

Additionally, the program executed by processor 134 copies the execution time data from memory module 136 to communication module 132 via bus 142. Communication module 132 outputs the execution time data for test instrument 130 together with an identifier indicating that the execution time data pertains to test instrument 130 to local area network 118. Local area network 118 conveys the execution time data to any one or more of the other test instruments 114 and external device 120. Those of the other test instruments 114 and external device 120 that receive the execution time data output by the communication module 132 of test instrument 130 now have exact information indicating the execution times taken by the test module 140 of test instrument 130 to perform respective test operations.

Additionally, the communication module 132 of test instrument 130 is capable of receiving respective execution time data output by one or more of the other test instruments 114 and conveyed to test instrument 130 by local area network 118. Processing module 134 causes such received execution time data to be transferred via bus 142 from communication module 132 to memory module 136, where the execution time data are stored. As a result, test instrument 130 has stored therein precise information indicating the execution times taken by those of the other test instruments 114 that output respective execution time data to perform respective test operations.

Finally, in response to a command issued by processing module 134, the communication module 132 of test instrument 130 is capable of requesting via local area network 118 that one or more of the other test instruments 114 provide respective execution time data. Communication module 132 receives such requested execution time data from local area network 118. Processing module 134 causes such received execution time data to be stored in memory module 136. As a result, test instrument 130 has precise information indicating the execution times taken by those of the remaining test instruments 114 that responded to the request to provide respective execution time data to perform respective testing operations.

In one embodiment, each of the other test instruments 114 constituting test system 100 transmits its respective execution time data via local area network 118 only to system controller 112. System controller 112 receives the execution time data from the other test instruments 114 and issues commands to the other test instruments based on the execution time data.

Test instrument 130 also differs from a conventional test instrument in that it is able to receive test results output by at least one other of the test instruments 114 and is able to process such test results. Such ability allows the overall test time to be reduced compared with a conventional automatic test system. As noted above, in a conventional test system, when a branching decision is based on test results generated by two or more of the test instruments, the test results generated by all the test instruments are communicated to the system controller. The system controller receives the test results, processes the test results to make a decision and then issues commands to the test instruments based on the decision.

FIG. 5 is a block diagram illustrating an example of a communication process performed by exemplary test instruments 152 and 154 and part of local area network 118 that collectively constitute part of test system 100. Test instruments 152 and 154 are similar in structure to test instrument 130 described above with reference to FIG. 4. Test instruments 152 and 154 jointly execute part of the test sequence used to test the UUT (not shown). At one point of the test sequence, test instruments 152 and 154 perform respective tests and generate test results DA and DB respectively. A branching decision is then made based on the result of on an application-specific calculation performed on the test results DA and DB generated by test instruments 152 and 154, respectively.

In test system 100, test instrument 152 sends test result DA directly to test instrument 154 via local area network 118, and test instrument 154 send test result DB directly to test instrument 152 via local area network 118. In test instrument 152 and test instrument 154, the processing modules 134 perform the same application-specific calculation each using its respective locally-generated test result and the test result received from the other of the test instruments. In a conventional test system such as that described above with reference to FIG. 1, each test instrument 14 would transmit its respective test result to system controller 12, and the system controller would perform the application-specific calculation and make a branching decision based on the result of the calculation. The system controller would transmit commands based on the branching decision to test instruments 14, as described above with reference to FIG. 3. However, in test system 100, there is no need for the back-and-forth communication process between test instruments 152 and 154 and system controller 112. Each test instrument 152, 154 autonomously makes a branching decision based on the test result it generates and the test result it receives from the other test instrument 154, 152 and executes the appropriate branch of the test sequence based on the branching decision.

If the application-specific calculation performed by each test instrument 152, 154 includes a timing specification, this can be based on time information provided by each test instrument's internal clock module 138. In this way the same system-wide logical and timing solution is achieved but with two fewer network messages. This eliminates the latency of the two messages from the total execution time.

FIGS. 6A and 6B are flow charts illustrating the processing performed by test instruments 152 and 154, respectively, while performing the test sequence just described. In block 160, test instrument 152 performs a testing operation that generates test result DA and, in block 162, transmits test result DA to test instrument 154 via local area network 118. In block 170, test instrument 154 performs a testing operation that generates test result DB and, in block 172, transmits test result DB to test instrument 152 via local area network 118. Thus, after blocks 162 and 172 have been performed, test results DA and DB exist in both of test instruments 152 and 154.

In block 164, test instrument 152 performs a calculation using locally-generated test result DA and test result DB received from test instrument 154. In block 174, test instrument 154 performs a calculation using locally-generated test result DB and test result DA received from test instrument 152. In block 166, test instrument 152 makes a branching decision in response to the result of the calculation performed in block 164. In block 176, test instrument 154 makes a branching decision in response to the result of the calculation performed in block 174. Since the calculations performed in blocks 164 and 174 are made using the same test results DA and DB, the calculations generate the same result, and test instruments 152 and 154 make the same branching decision in blocks 166 and 176.

In block 168, test instrument 152 performs the next testing operation in the chosen branch of its test sequence and, in block 178, test instrument 154 performs the next testing operation in the chosen branch of its test sequence. The testing operations performed by test instruments 152 and 154 are typically different but typically constitutes respective parts, e.g., stimulus generation and response measurement, of a next test performed on the UUT.

The processing performed in the example shown in FIGS. 6A and 6B can be executed more quickly than that shown in FIG. 3 because two fewer communication operations are performed in FIGS. 6A and 6B. Thus, providing test instruments 114 with the ability to communicate with one another vial local area network 118 and the ability to perform calculations using locally-generated test results and test results received from another of the test instruments allows the number of communication operations to be reduced. Reducing the number of communication operations eliminates the communication latency of the eliminated communication operations. Thus, automatic test system 100 has an increased testing throughput than conventional automatic test system 10.

Moreover, clock module 138 in each of test instruments 152 and 154 allows these test instruments to perform tests that include a timing specification. A time signal provided by the clock module 138 in each test instrument provides a time reference against which a property of the UUT is tested.

Additionally, the presence of clock modules 138 in test instruments 114 and the synchronization of the clock modules 138 via local area network 118 such that test instruments 114 have a common sense of time allows test instruments 114 to perform respective actions with a specified timing. For example, the synchronized clock modules enable test instruments 152 and 154 to perform test sequences having a timing specification, such as:

1. If DA==DB then the DUT passes test n.
2. If the DUT has passed test n, change the configuration of test instrument 152 to perform test n+1 immediately and, 100 ns later, change the configuration of test instrument 154 to perform test n+1.
3. If DA not=DB then do not change the configuration of test instruments 152 and 154, but repeat test n by executing a new measurement of both DA and DB immediately.

In performing such test sequence, the timings are determined from the execution time data of the test instruments and the time signals provided by the clock modules 138 in the test instruments. Moreover, the timings are independent of the identity of the test instruments used to perform the test sequence, and therefore remain unchanged when one instance of test instrument 152 replaces another instance of test instrument 152. The timings remain unchanged even if the different instances of test instrument 152 have different execution time data because the different execution times, as represented by the execution time data, are taken into account in performing the test sequence so that the timings specified in the test sequence are obtained. This would not be the case if the timings were obtained by introducing wait states into the test program, as is done conventionally.

Figure 7A:
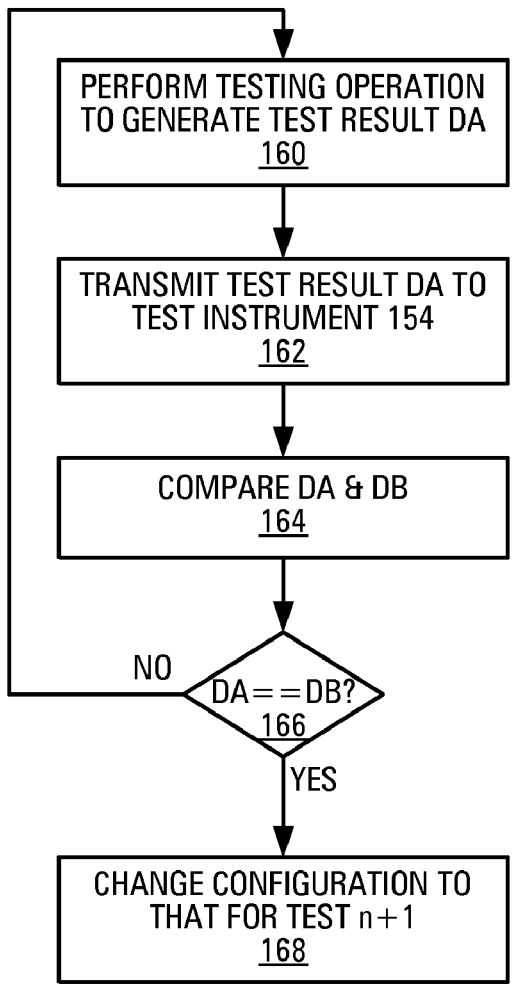
FIGS. 7A and 7B are flowcharts that provide a specific example of the processing shown in FIGS. 6A and 6B in which an exemplary test sequence is executed.
Figure 7B:
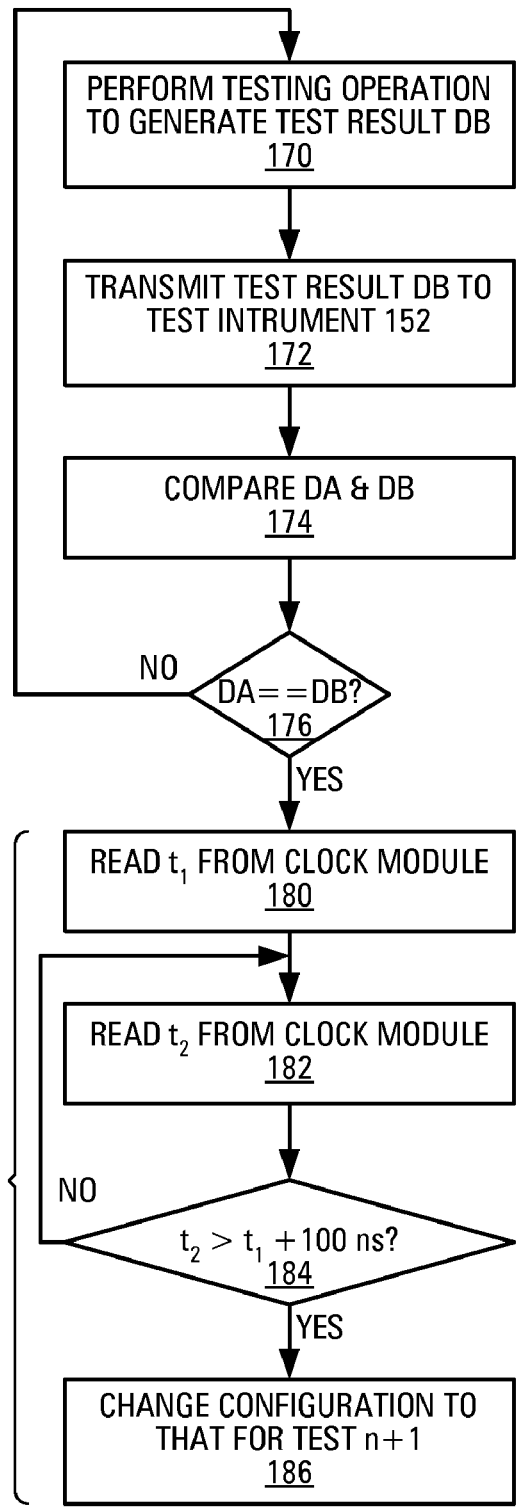

An example of a test sequence optimization that can be accomplished with automatic test system 100 will now be described with reference to FIGS. 5, 7A and 7B. FIGS. 7A and 7B are flowcharts that provide a specific example of the processing described above with reference to FIGS. 6A and 6B in which the above-described test sequence is executed. In FIGS. 7A and 7B, blocks 160, 162, 170 and 172 are identical to the like-numbered blocks shown in FIGS. 6A and 6B, respectively. The calculations performed in blocks 164 and 174 compare test result DA with test result DB, and the branching decisions made in blocks 166 and 176 are made in response to whether test result DA is equal to test result DB. Blocks 160, 162, 164, 166, 170, 172, 174 and 176 represent operations executed to perform test n.

A YES result obtained in block 166 of FIG. 7A causes execution immediately to pass to block 168, where the configuration of test instrument 152 is changed to that for test n+1. Similarly, a YES result obtained in block 176 causes execution to pass to block 178 where, 100 ns after the configuration of test instrument 152 is changed to that for test n+1, the configuration of test instrument 154 is changed to that for test n+1.

In the example shown, block 178 is composed of four sub-blocks. In block 180, a time $t_1$ is read from clock module 138. In block 182, a time $t_2$ is read from clock module 138. In block 184, test is performed to determine whether time $t_2$ is more than 100 ns later than time $t_1$. A NO result in block 184 causes execution to return to block 182, typically via a defined delay (not shown), where time $t_2$ is read again from clock module 138. A YES result in block 184 causes execution to advance to block 186, where the configuration of test instrument 154 is changed to that for test n+1. Due to the delay introduced by repetitively executing blocks 182 and 184, the configuration of instrument 154 changes 100 ns later than that of test instrument 152.

On the other hand, NO results obtained in blocks 166 and 176 cause the configurations of test instruments 152 and 154 to remain unchanged and execution to return immediately to blocks 160 and 170, respectively, where the testing operations that perform test n to generate test results DA and DB are repeated. In this example, the test operations performed in blocks 160 and 168 are respectively the next test operation of the two branches of the test sequence performed by test instrument 152, and the test operations performed in blocks 170 and 178 are respectively the next test operation of the two branches of the test sequence performed by test instrument 154.

It should be noted that the term "immediately" has no meaning in conventional automatic test system 10 described above with reference to FIG. 1. This is because, for example, the times required for conventional test instruments 14 to change their respective testing configurations are not known. Instead, timing coordination is typically performed by system controller 12 based on an exchange of messages between the test instruments and the system controller. The timing with which system controller 12 sends commands to test instruments 14 is adjusted by a programmer inserting wait states into the test sequence performed system controller to achieve the desired timing. This is a time-consuming and therefore expensive process. Moreover, the timing adjustments need to be repeated every time a component of automatic test system 10 is changed.

In test system 100 in accordance with an embodiment of the invention, test instruments 114 have known execution times, for example, the time needed by the test instrument to change its test configuration from one configuration to another, or to perform a specified testing operation. Moreover, the execution data for a given test instrument are machine readable by remote or local query and are made available to devices that need the execution time data. The devices can obtain the execution time data by querying the test instrument to discover its execution time data, or by the test instrument including its execution time data, or a relevant portion of its execution time data, in application-specific code or in the messages in which test results are transmitted to one or more others of the test instruments, such as the messages that include test results DA or DB.

In another example, the term "immediately" can be defined in terms of the time indicated by the latest of timestamps included in the messages that include test results DA or DB. The time stamps are obtained from clock module 138 and are inserted into the respective message by processing module 134 prior to the message being sent to communication module 132 for transmission. The time stamp in a given message is adjusted in accordance with the test instrument-specific execution time in such a way that produces the desired system-wide execution timing. For example, the time stamp in the message is adjusted in accordance with an execution time indicating the set-up time needed by the test instrument to change its test configuration to that of the next test specified in the test sequence. With such adjustment, two test instruments having significantly different set-up times can perform related test operations simultaneously or with an accurately-defined temporal offset. This technique has the advantage that timing in test system 100 does not depend on the duration of wait states whose actual value will change if any one of the test instruments 114 is changed. Instead, the timing depends on the tolerances of the execution time data stored in the memory module 136 of each of the test instruments, and the tolerances with which clock modules 138 are synchronized. Both of these tolerances can be taken into account in the above-described timing computations. Moreover, both of these tolerances are essentially independent of such things as the operational speed of system controller 112 or the other test instruments 114.

Using timings based on the execution time data stored and communicated by the test instruments 114 constituting test system 100 and defining the test sequence performed by test system 100 in terms of such execution time data allow the test instruments 114 constituting test system 100 to be substituted or upgraded without material effects on the execution of the test sequence. Moreover, in embodiments of test system 100 in which the execution time data of a given one or more of test instruments 114 varies, the test system can still execute the test sequence with its specified timing provided that the test instrument in question makes current execution time data available when the test sequence is executed, and the current execution time data is used in the computations performed by the test system. The current execution time data can be made available by query, for example. Such variation in the execution time data can arise due to variations in parameters such as signal level, operating temperature, measurement range or other factors. Uncorrected, execution time data variations arising from variation in the above-described parameters limit the timing precision with which the test sequence is executed. In conventional automatic test systems, execution time variations arising from variations in such parameters cannot easily be accounted for and contribute to measurement uncertainty.

Not only can test-instrument-specific execution time data be used to provide a more robust system-wide timing, the execution time data can also be used to optimize the way in which test system 100 executes a given test sequence. This optimization will be described with reference to an example in which the way in which test system 100 optimizes execution of a portion of a test sequence similar to that described above with reference to FIG. 2. Specifically, the execution time data can be used to design a speculatively-executed test sequence that provides a reduction in the time needed to test a majority of the UUTs at the expense of an increase in the time needed to test a minority of the UUTs. The optimization is performed to reduce the average time taken to test each UUT.

Figure 8A:
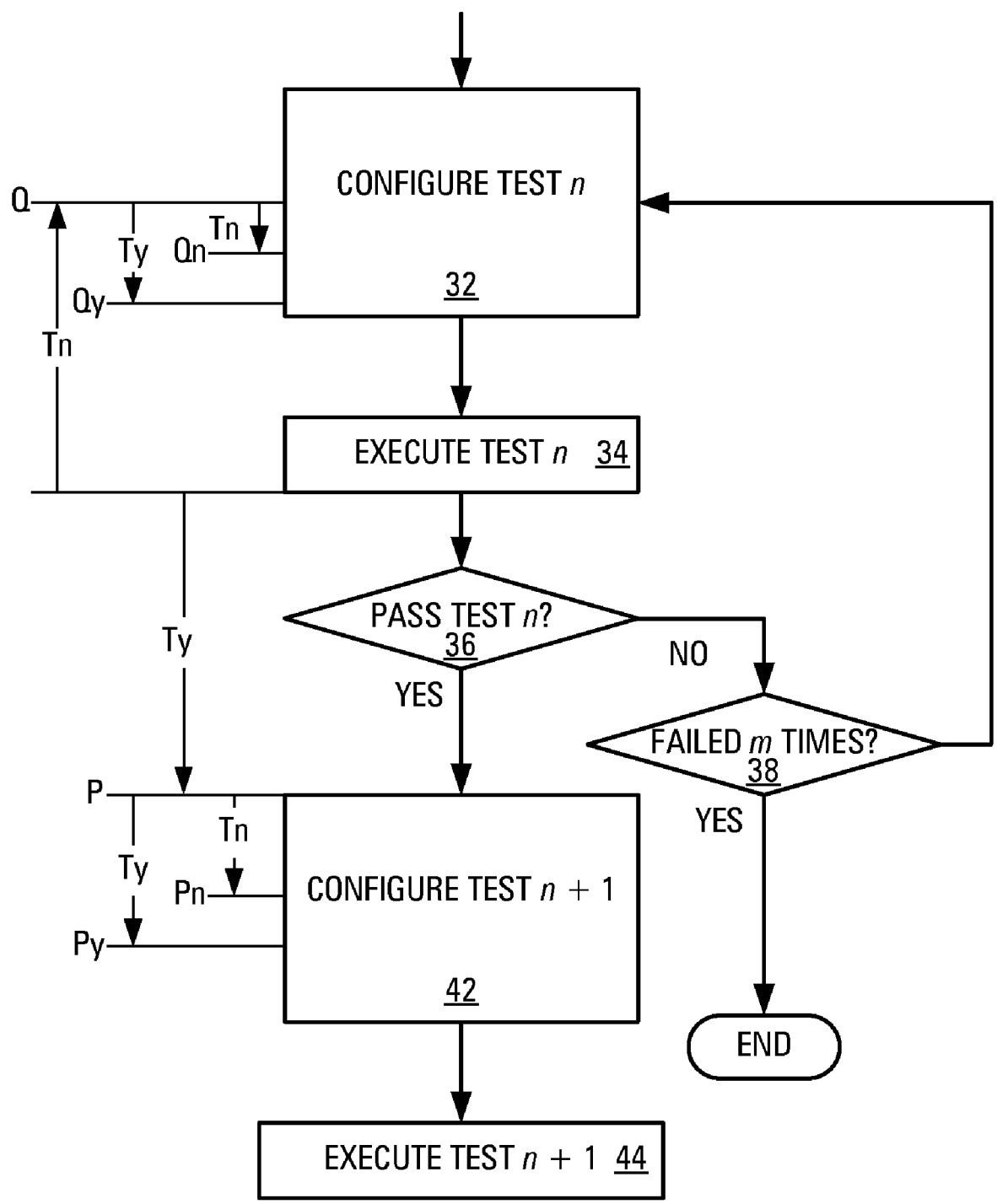
FIG. 8A is a flow chart showing exemplary elapsed times based on execution time data for a non-speculatively executed test sequence similar to that shown in FIG. 2.
Figure 8B:
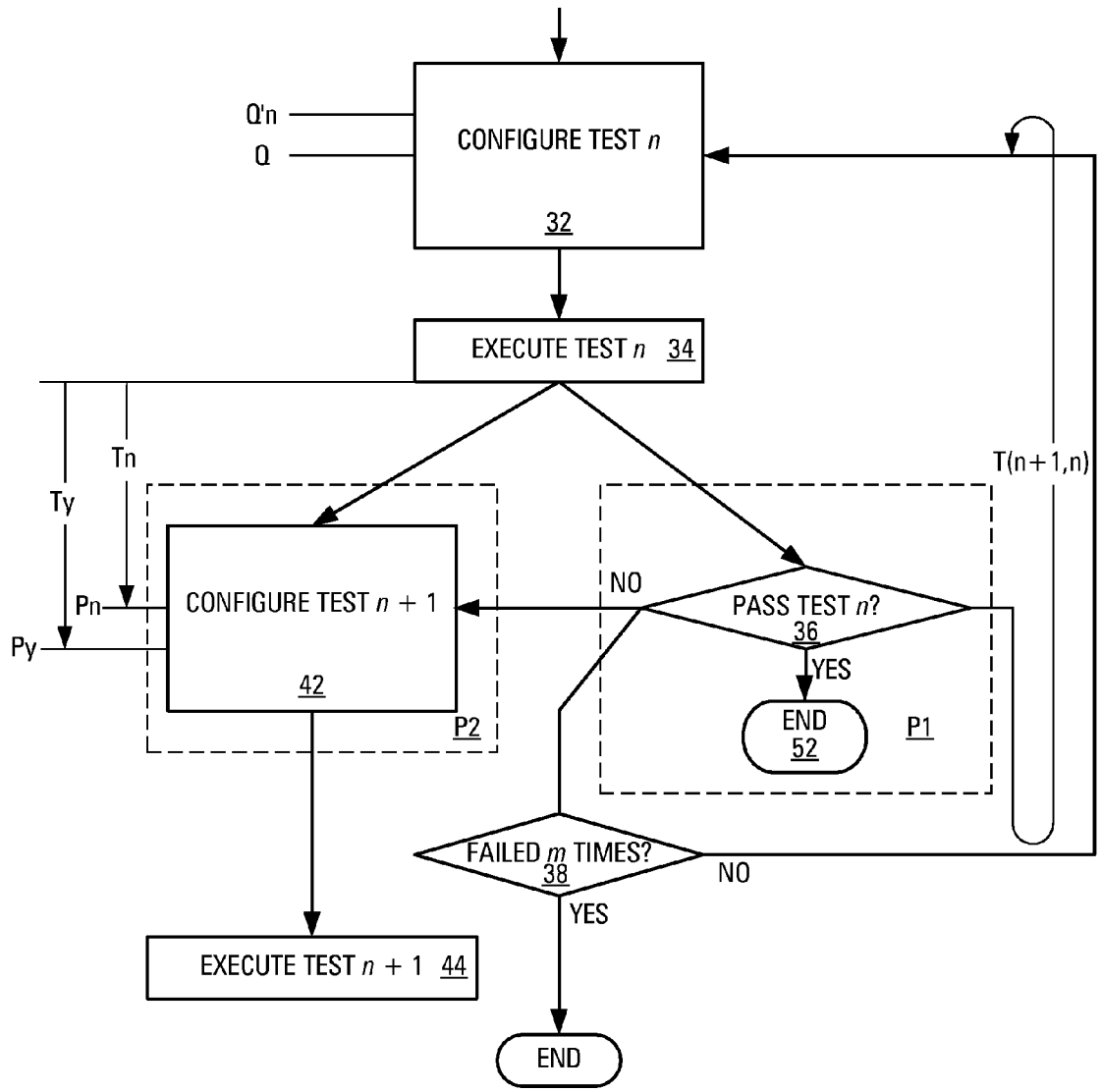
FIG. 8B is a flow chart showing speculative execution of the YES branch in FIG. 8A.
Figure 8C:
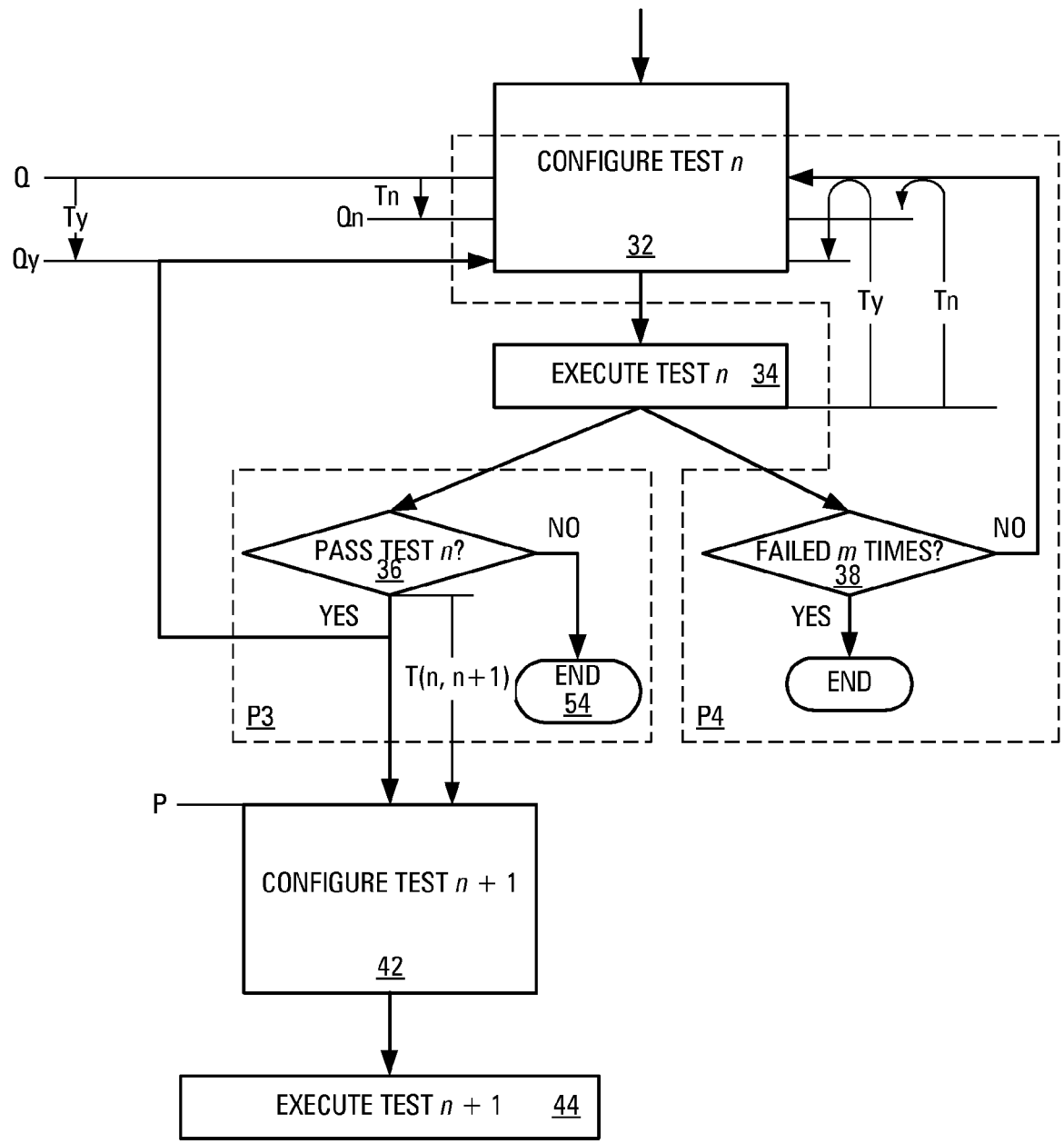
FIG. 8C is a flow chart showing speculative execution of the NO branch in FIG. 8A.

FIGS. 8A-8C are schematic flow charts showing a test sequence portion similar to the test sequence portion shown in FIG. 2. In FIGS. 8A-8C, some of the blocks have a more than minimal height to indicate that the test operations indicated therein are performed in non-zero time. FIGS. 8A-8C show various elapsed times each of which is a time taken for execution to progress from one execution point to another in the test sequence. Each of the elapsed times is denoted by the letter T with an appended suffix that distinguishes the elapsed times from one another.

The elapsed times are derived from the execution time data obtained from the respective memory modules 136 of the test instruments 114 constituting test system 100. The execution time data includes execution times each indicating a time taken for the respective test instrument to perform a test operation that constitutes part of the test sequence portion shown in FIGS. 8A-8C. Each of the elapsed times is obtained by summing relevant ones of the execution times. In cases in which a test operation involves communicating test results among the test instruments 114 of test system 100, the elapsed times are obtained by summing the relevant execution times with respective communication latencies obtained by characterizing local area network 118. In some embodiments, the elapsed times are derived from the execution time data by an individual or system that designs the execution of the test sequence executed by test system 100. In other embodiments, the elapsed times are derived by a test sequence optimization program performed by the processing module 134 of system controller 112 or another of the test instruments 114. In yet other embodiments, the elapsed times are derived initially by the test sequence designer and are later revised by the test sequence optimization program.

In the examples shown in FIGS. 8A-8C, the branching decision performed in block 36 takes a non-trivial time, as is typical when one or more test results are communicated from one of the test instruments 114 to another of the test instruments, such as system controller 112, and commands are communicated from one of the test instruments 114, such as system controller 112, to one or more of the other test instruments. Specifically, the branching decision performed in block 36 takes an execution time Tn to return a NO decision and an execution time Ty to return a YES decision. Depending on the test executed in block 34, execution time Tn is greater than, less than or equal to execution time Ty. Execution times Tn and Ty are both less than the execution time of block 32 in which test system 100 is configured to perform test n, and less than the execution time of block 42 in which test system 100 is configured to perform test n+1.

FIG. 8A shows an example in which the portion of the test sequence is performed non-speculatively such that execution of the test sequence portion waits until block 36 returns a branching decision. Then, depending on the branching decision, execution proceeds along a path marked YES to block 42, or proceeds along a path marked NO that extends from block 36 via block 38 to block 32. The path marked YES will be referred to as the YES path and the path marked NO will be referred to as the NO path.

FIG. 8A additionally shows six specific execution points in the test sequence portion relevant to speculative and non-speculative executions of the test sequence portion. Point P indicates the start of executing block 42. Point Q indicates an entry point in block 32 to which execution proceeds when test n is repeated following a NO result in block 36. Typically, all of the process of configuring test system 100 to perform test n does not have to be performed when test n is being repeated. Execution points Pn and Py are relevant to the speculative execution of the YES path described below with reference to FIG. 8B. Point Pn is the point to which execution of block 42 advances from point P in an elapsed time equal to execution time Tn. Point Py is the point to which execution of block 42 advances from point P in an elapsed time equal to execution time Ty. Execution points Qn and Qy are relevant to the speculative execution of the NO path described below with reference to FIG. 8C. Point Qn is the point to which the execution of block 32 advances from point Q in an elapsed time equal to execution time Tn. Point Qy is the point to which the execution of block 32 advances from point Q in an elapsed time equal to execution time Ty.

When block 36 returns a YES decision in the non-speculative example shown in FIG. 8A, the elapsed time taken by test system 100 to progress from completion of executing test n in block 34 to point P at the start of configuring test n+1 in block 42 is execution time Ty, and the elapsed time taken by the test system to progress from the start of block 42 to above-described point Py in block 42 is equal to execution time Ty as a result of the definition of point Py. Thus, the elapsed time taken for execution to progress to point Py from completion of executing test n in block 34 is Ty+Ty=2Ty. Alternatively, when block 36 returns a NO decision in the non-speculative example shown in FIG. 8A, the elapsed time taken by test system 100 to progress from completion of executing test n in block 34 to entry point Q in configuring test n in block 32 is time Tn, assuming that the execution time of block 38 is negligible compared with time Tn. Additionally, the elapsed time taken by test system 100 to progress from entry point Q to above-described point Qn in block 32 is equal to execution time Tn as a result of the definition of point Qn. Thus, the elapsed time taken for execution to progress to point Qn from completion of executing test n in block 34 is Tn+Tn=2Tn.

When one of the outcomes of the branching decision made in block 36 is predominant over the other, the path that would be executed after the predominant outcome, i.e., the YES path or the NO path, can be executed speculatively. The speculatively-executed path extending from decision block 36 is executed in parallel with block 36 so that execution of the speculatively-executed path is not delayed by waiting for block 36 to return a branching decision. Techniques using multiple threads, multiple processor cores, multiple processors or other devices for implementing parallel or effectively parallel execution are known in the art and can be used.

FIG. 8B shows an example of a speculative execution of the YES path extending from block 36. Such speculative execution is performed when a YES decision is obtained in block 36 for a significant majority of the UUTs and reduces the average testing time of the UUTs. In this example, after completion of executing test n in block 34, execution progresses along two parallel paths. A first parallel path P1 includes block 36 in which the branching decision is made, as described above. A second parallel path P2 includes block 42 in which the test system configures test n+1. Execution of parallel path P2 does not wait for block 36 in parallel path P1 to return the branching decision. Execution of path P1 and path P2 proceeds in parallel until block 36 in parallel path P1 returns the branching decision.

In a majority of cases, after execution time Ty, block 36 returns a YES decision. A YES decision causes execution of parallel path P1 to advance to block 52, where it ends. This allows the execution of block 42 in parallel path P2, which has already reached point Py in the time that elapses before block 36 returns the YES decision, to continue uninterrupted. The speculative execution of the YES path, as shown in FIG. 8B, reduces the testing time of the UUTs for which a YES decision is returned in block 36 because in the time that would be spent waiting for the branching decision in block 36, execution of block 42 has instead advanced to point Py.

In the non-speculative example shown in FIG. 8A, the time that elapses executing the YES path between the completion of executing test n and execution reaching point Py in block 42 is twice the YES decision time Ty of block 36, i.e., 2Ty. In the example of speculative execution of the YES path shown in FIG. 8B, the time that elapses between the completion of executing test n and execution reaching point Py in block 42 is simply the YES decision time Ty of block 36 because the execution of block 42 begins immediately once the execution of block 34 is complete. Thus, the speculative YES path execution shown in FIG. 8B reduces the testing time of each UUT for which block 36 returns a YES decision by a time 2Ty−Ty=Ty.

In the example shown in FIG. 8B, block 36 returns a NO decision for a minority of the UUTs. With respect to such UUTs, the speculative execution of the YES path can be regarded as having failed. Execution of block 42 in parallel path P2 has reached point Pn in the execution time taken by block 36 to return the NO decision. The NO decision returned by block 36 causes test system 100 to stop executing block 42 at point Pn and to execute instead the NO path extending from block 36 and starting with block 38. Note that, following a failed speculative execution of the YES path, execution typically has to return to a point earlier in the execution of block 32 than entry point Q because some of the configuration of test n+1 performed in block 42 has to be undone in block 32 to configure test system 100 once more to perform test n. Such earlier entry point is indicated as point Q'n FIG. 8B. As a result, the failed speculative execution of the YES path incurs a time penalty.

In the non-speculative example shown in FIG. 8A, the time that elapses executing the NO path between the completion of executing test n and execution reaching point Q in block 32 is equal to the NO decision time Tn of block 36, as described above. In the example of the failed speculative execution of the YES path shown in FIG. 8B, the time that elapses between the completion of executing test n and execution reaching point Q in block 42 is the sum of the NO decision time Tn of block 36 and the elapsed time T(n+1, n) taken by test system 100 to progress from block 36 returning the NO decision to point Q in block 32 via entry point Q'n. Thus, when block 36 returns a NO decision, the failed speculative execution of the YES path shown in FIG. 8B incurs a time penalty of (Tn+T(n+1, n))−Tn=T(n+1, n). Elapsed time T(n+1, n) is calculated from the execution times of the test operations performed in advancing from block 36 returning the NO decision to execution reaching point Q in block 32 via entry point Q'n.

In the example shown in FIG. 8B, in which the YES path is speculatively executed, the testing time of each UUT for which a NO decision is returned in block 36 is increased by the above-described time penalty due to the time needed to switch execution to the NO path. However, provided that the product of the time penalty and the fraction of UUTs for which a NO decision is returned in block 36 is less than the product of the decrease in testing time and the fraction of UUTs for which a YES decision is returned in block 36, speculative execution of the YES branch as shown in FIG. 8B reduces the average testing time of the UUTs.

FIG. 8C shows an example of speculative execution of the NO path extending from block 36. Such speculative execution is performed when a NO decision is returned in block 36 for a significant majority of the UUTs and reduces the average testing time of the UUTs. In this example, after completion of executing test n in block 34, execution progresses along two parallel paths. A first parallel path P3 includes block 36 in which the branching decision is made, as described above. A second parallel path P4 extends from block 34 via block 38 to block 32, in which test system 100 configures test n. Execution of parallel path P4 does not wait for block 36 in parallel path P3 to return the branching decision. Execution of path P3 and path P4 proceeds in parallel until block 36 in parallel path P3 returns the branching decision.

In a majority of cases, after execution time Tn, block 36 returns a NO decision. A NO decision causes execution of parallel path P3 to advance to block 54, where it ends. This allows the execution of parallel path P4, which has already reached point Qn in the time that elapses before block 36 returns the NO decision, to continue uninterrupted. The speculative execution of the NO path, as shown in FIG. 8C, reduces the testing time of the UUTs for which a NO decision is returned in block 36 because in the time that would be spent waiting for the branching decision in block 36, execution of block 38 and block 32 has instead advanced to point Qn.

In the non-speculative example shown in FIG. 8A, the time that elapses executing the NO path between the completion of executing test n and execution reaching point Qn in block 32 is twice the NO decision time Tn of block 36, i.e., 2Tn. In the example of speculative execution of the NO path shown in FIG. 8C, the time that elapses between the completion of executing test n and execution reaching point Qn in block 32 is simply the NO decision time Tn of block 36 because execution of block 38 in parallel path P4 begins immediately once the execution of block 34 is complete. Thus, the speculative NO path execution shown in FIG. 8C reduces the testing time of each UUT for which block 36 returns a NO result by a time 2Tn−Tn=Tn.

In the example shown in FIG. 8C, block 36 returns a YES decision for a minority of the UUTs. With respect to such UUTs, the speculative execution of the NO path can be regarded as having failed. Execution of block 32 in parallel path P4 has reached point Qy in the execution time taken by block 36 to return the YES decision. The YES decision returned by block 36 causes test system 100 to stop executing block 32 in parallel path P4 at point Qy and to execute instead the YES path extending from block 36 and starting with block 42. In this case, some additional execution of block 32 is typically necessary to put the test system 100 into a state that allows block 42 to be performed. Thus, after block 36 returns a YES decision, the process of stopping execution of block 32 and advancing execution to the beginning of block 42 takes a non-trivial elapsed time of T(n, n+1), which constitutes a time penalty incurred by a failed speculative execution of the NO path. Elapsed time T(n, n+1) is calculated from the execution times of the test operations performed in the process of advancing from block 36 returning a YES decision to execution reaching the beginning of block 42.

In the non-speculative example shown in FIG. 8A, the time that elapses executing the YES path between the completion of executing test n and execution reaching point P at the beginning of block 42 is equal to the YES decision time Ty of block 36, as described above. In the example of the failed speculative execution of the NO path shown in FIG. 8C, the time that elapses between the completion of executing test n and execution reaching point P at the beginning of block 42 is the sum of the YES decision time Ty of block 36 and the elapsed time T(n, n+1) taken by test system 100 to advance from block 36 returning the YES decision to point P at the beginning of block 42. Thus, when block 36 returns a YES decision, the failed speculative execution of the NO path shown in FIG. 8C incurs a time penalty of (Ty+T(n, n+1))−Ty=T(n+1, n).

In the example shown in FIG. 8C in which the NO path is speculatively executed, the testing time of each UUT for which a YES decision is returned in block 36 is increased by the above-described time penalty due to the time needed to switch execution to the YES path. However, provided that the product of the time penalty and the fraction of UUTs for which a YES decision is returned in block 36 is less than the product of the decrease in testing time and the fraction of UUTs for which a NO decision is returned in block 36, speculative execution of the NO branch as shown in FIG. 8C reduces the average testing time of the UUTs.

The above-described elapsed times T(n+1, n) and T(n, n+1), together with statistical data on the branching decisions made in block 36 enables the test sequence designer or a test sequence optimization routine to determine whether speculative execution of one of the paths following block 36 would reduce the average testing time of the UUTs, and, if so, which path should be executed speculatively. Because production yields change (and typically increase) with time, the speculative execution decisions should be re-evaluated from time-to-time after the start of manufacturing UUTs in accordance with a given product design and production process. A speculative execution decision that is valid at the beginning of production can become invalid as the production process matures and yields increase.

Bayesian methods can be used to determine the probabilities of each path following a branching decision based on current operating experience. This makes the time optimization of test system 100 more robust in the face of changing production yields.

Turning again to FIG. 4, the manufacturer of each of the test instruments 114 stores execution time data for the test instrument in the memory module 136 of the test instrument. Ideally, the execution time data initially stored in memory module 136 is composed of a measured execution time for each test operation the test operations the test instrument is capable of performing. Each measured execution time is obtained by measuring the execution time of the test instrument itself, typically during final test. Alternatively, the measured execution times initially stored in memory module 136 may be those for only a subset of the test operations the test instrument is capable of performing. In this case, the remainder of the execution time data initially stored in memory module 136 is composed of typical execution times that pertain to the test instrument model but are not individualized for the test instrument itself. In some cases, measured execution times are provided for only a basic set of test operations. Alternatively, the execution time data initially stored in memory module 136 is composed exclusively of typical execution time data and need not cover every test operation the test instrument is capable of performing.

During operation of each test instrument 114, part of the program executed by processing module 134 updates the execution time data initially stored in memory module 136 with operational execution times determined by measuring the execution times of the test operations performed by the test instrument in the course of testing UUTs, as will be described in more detail below. The updating process automatically individualizes and, where appropriate, expands the execution time data stored and output by test instrument 114. This allows typical execution times for the test instrument model to be used as at least part of the execution time data initially stored in memory module 136, and allows execution time data for some test operations to be omitted from the initially-stored execution time data.

When each test instrument 114 is powered up, and from time-to-time thereafter, the program (not shown) executed by processor 134 causes memory module 136 to read out the execution time data stored therein to bus 142 and causes communication module 132 to output the execution time data to local area network 118 for transmission to system controller 112 and optionally to others of the test instruments 114. Additionally the program executed by processor 134 causes clock module 138 to synchronize, via communication module 132 and local area network 118, with the clock modules of the other test instruments 114 to give test instruments 114 a common sense of time.

One or more of the test instruments 114 executes a testing program in which timing-dependent aspects are represented by respective variables. On start-up of test system 100 and on receiving execution time data from local area network 118, the testing program inserts appropriate ones of the execution time data received from local area network 118 or from its own memory module 136 into the variables of the testing program. As a result, the timing-dependent aspects of the testing program depend on the execution time data of the test instruments 114 constituting test system 100.

As test system 100 is used to test UUTs, part of the testing program (not shown) executed by the processor 134 in each test instrument 114 causes the processor to measure respective operational execution times for the test operations, or a subset thereof, performed by the test instrument. Such execution time measurements are performed using time information provided by clock module 138. The testing program additionally causes the processor to compare the operational execution times with the execution time stored in memory module 136 for the same test operation. In the event that an operational execution time differs from the stored execution time stored for the same test operation, processor 134 updates the execution time stored in memory module 136 with the operational execution time and outputs the updated execution time to local area network 118 as described above. Prior to the updating process just described, processor 134 typically performs such data analysis operations as maximum value determination, minimum value determination, average value determination and outlier elimination on the raw operational execution times for each test operation to generate the operational execution time for comparison with the stored execution time in the updating operation. Processor 134 additionally controls the frequency with which the updating process is performed.

If an original one of test instruments 114 is replaced by a replacement test instrument, the replacement test instrument transmits its execution time data to the other test instruments 114 constituting test system 100. Each testing program performed by test system 100 then updates its timing-dependent variables using the execution time data of the replacement test instrument. As a result, the timing-dependent aspects of the testing performed by test system 100 remain unchanged notwithstanding the use of a replacement test instrument. In embodiments in one or more of the testing programs comprises a test time optimization module, as described above, receiving execution time data from a replacement test instrument may trigger execution of the test time optimization module to ensure that test times are optimized for test system 100 with the replacement test instrument installed.

This disclosure describes the invention in detail using illustrative embodiments. However, the invention defined by the appended claims is not limited to the precise embodiments described.

We claim:

1. A test instrument for use in a test system composed at least in part of test instruments having a common sense of time, the test instrument comprising:
   a test module characterized by execution time data, the execution time data comprising an execution time taken for the test module to perform a respective test operation;
   a memory module in which the execution time data are stored;
   a communication module operable to output the execution time data; and
   a clock module synchronizable via the communication module with at least one other of the test instruments to establish the common sense of time, the clock module operable to generate a time signal.

2. The test instrument of claim 1, additionally comprising a processing module operable in response to the execution time data and the time signal to control operation of the test module.

3. The test instrument of claim 1, additionally comprising a processing module operable to cause the test module to perform a testing operation speculatively, depending on the execution time data.

4. The test instrument of claim 1, in which:
   the execution time data is first execution time data;
   the communication module is operable to receive second execution time data from another of the test instruments; and
   the memory module additionally stores the second execution time data.

5. The test instrument of claim 4, additionally comprising a processing module operable in response to the first execution time data to control the test module.

6. The test instrument of claim 5, in which the processing module is additionally operable in response to the second execution time data to control the test module.

7. The test instrument of claim 1, in which:
   the test instrument additionally comprises a processing module operable to measure an operational execution time taken by the test module to perform the test operation and to cause the measured operational execution time to be stored in the memory module as a respective updated execution time for the test operation; and
   the communication module is additionally operable to output the updated execution time for the test operation.

8. A test system, comprising:
   test instruments having a common sense of time, at least one of the test instruments comprising:
      a test module characterized by execution time data, the execution time data comprising an execution time taken by the test module to perform a respective testing operation,
      a memory in which the execution time data are stored,
      a communication module operable to output the execution time data to at least one other of the test instruments; and
      a clock module synchronizable via the communication module with at least one other of the test instruments to establish the common sense of time, the clock module operable to generate a time signal.

9. The test system of claim 8, in which the one of the test instruments additionally comprises a processing module operable in response to the execution time data and the time signal to control operation of the test module.

10. The test system of claim 8, in which the one of the test instruments additionally comprises a processing module operable to cause the test module to perform a testing operation speculatively, depending on the execution time data.

11. The test system of claim 8, in which:
   the execution time data is first execution time data;
   the communication module is operable to receive second execution time data from another of the test instruments; and
   the memory module additionally stores the second execution time data.

12. The test system of claim 11, in which the one of the test instruments additionally comprises a processing module operable in response to the first execution time data to control the test module.

13. The test system of claim 8, in which:
   the one of the test instruments additionally comprises a processing module operable to measure an operational execution time taken by the test module to perform a test operation and to cause the measured operational execution time to be stored in the memory module as a respective updated execution time for the test operation; and the communication module is additionally operable to output the updated execution time for the test operation.

14. A measurement method, comprising:

providing a test instrument, the test instrument comprising a clock and constituting part of a test system composed at least in part of test instruments having a common sense of time, the test instrument characterized by execution time data, the execution time data comprising an execution time taken by the test instrument to perform a respective test operation;

synchronizing the clock with at least one other of the test instruments to establish the common sense of time, the clock generating a time signal;

storing the execution time data in the test instrument; and outputting the execution time data from the test instrument.

15. The measurement method of claim 14, additionally comprising controlling, in response to the execution time data and the time signal, a test operation performed by the test instrument.

16. The measurement method of claim 15, in which the controlling comprises performing the test operation speculatively, depending on the execution time data.

17. The measurement method of claim 15, additionally comprising:

measuring an operational execution time taken by the test instrument to perform the test operation;

storing the measured operational execution time as a respective updated execution time for the test operation; and outputting the updated execution time for the test operation from the test instrument.

18. The measurement method of claim 14, in which:

the execution time data is first execution time data;

the method additionally comprises receiving second execution time data from another of the test instruments; and the storing comprises additionally storing the second execution time data in the test instrument.

19. The measurement method of claim 18, in which:

the test instrument is a first test instrument and another of the test instruments is a second test instrument; and the method additionally comprises, at the first test instrument:

performing the test operation to generate a first test result, receiving a second test result from the second test instrument, making a branching decision in response to the first test result and the received second test result, and selectively performing a test operation in response to the branching decision.

20. The measurement method of claim 19, additionally comprising:

transmitting the first test result from the first test instrument to the second test instrument; and at the second test instrument:

receiving the first test result from the first test instrument, making the same branching decision as the first test instrument in response to the received first test result and the second test result, and selectively performing a test operation in response to the branching decision.

21. The measurement method of claim 14, additionally comprising:

calculating from the execution time data a decrease in testing time obtained and a time penalty incurred by respectively successfully and unsuccessfully executing two branches of a test sequence; and deciding on whether to execute the test sequence speculatively based on the decrease in testing time, the time penalty and an expected fraction of units under test for which speculative execution of the test sequence would be successful.

22. The measurement method of claim 21, additionally comprising determining which of the branches to execute speculatively based on the decrease in testing time, the time penalty and the expected fraction.

* * * * *